United States Patent [19]

Guy

[11] Patent Number: 5,648,773

[45] Date of Patent: Jul. 15, 1997

[54] DATA COMPRESSION TRANSMISSION SYSTEM

[75] Inventor: Jean-Yves Guy, Bois D'Arcy, France

[73] Assignee: U.S. Philips Corporation, New York, N.Y.

[21] Appl. No.: 490,483

[22] Filed: Jun. 14, 1995

[30] Foreign Application Priority Data

Jun. 15, 1994 [FR] France ...................... 94 07306

[51] Int. Cl.⁶ ............................................. H03M 7/30
[52] U.S. Cl. ..................................................... 341/51
[58] Field of Search ........................ 341/51, 59, 106, 341/87, 67, 90, 89

[56] References Cited

U.S. PATENT DOCUMENTS

| | | | |
|---|---|---|---|
| 3,940,626 | 2/1976 | Hounsfield | 250/366 |
| 4,847,619 | 7/1989 | Kato et al. | 341/106 |
| 5,177,480 | 1/1993 | Clark . | |
| 5,258,983 | 11/1993 | Lane et al. | 370/118 |

FOREIGN PATENT DOCUMENTS

| | | |
|---|---|---|
| 0313190 | 4/1989 | European Pat. Off. . |
| 0493286 | 7/1992 | European Pat. Off. . |

*Primary Examiner*—Brian K. Young
*Attorney, Agent, or Firm*—Jack D. Slobod

[57] ABSTRACT

A transmitter and a receiver of a data compression transmission system which are synchronized comprise switch means for switching, when a compression is no longer effective, from a first data compression mode of operation to a second mode of operation called release mode and according to which the data are transmitted or received directly without compression or decompression, for the transmission and reception, respectively, of a predetermined number of data.

7 Claims, 3 Drawing Sheets

DATA COMPRESSION TRANSMISSION SYSTEM

FIELD OF THE INVENTION

1. Background of the Invention

The present invention relates to a data transmission system comprising at least a transmitter and a receiver which comprise each switch means for switching between a first mode of operation according to which the transmitted or received data are encoded or decoded to compress or decompress them, and a second mode of operation according to which the data are transmitted or received directly without encoding or decoding.

The invention has highly significant applications especially in the field of transmission over public networks and more particularly when these networks utilize a packet charging mode. In effect, the effectiveness of data compression techniques depends on the type of processed data. When these data are random or already compressed, the compression may in fact have an expanding effect on the data which may reach in a worst case 10 to 15 percent by volume. In terms of numbers of packets or charging segments, this expansion may be much more considerable with in the worst case a doubling of the number of packets. Besides, for the greater part of the compression algorithms, the machine time spent on data compression is all the longer as the data can be compressed less. The compression of data that cannot be compressed much thus calls forth a considerable waste of processing power.

2. Discussion of the Related Art

U.S. Pat. No. 5,177,480 describes a solution which makes it possible to limit the compression of such data.

This solution consists of utilizing for the data transmission from a transmitter to a receiver a compression method according to which the transmitter and the receiver can switch between a mode called compression mode and a mode called transparent mode in the following manner. At the beginning, the transmitter and the receiver operate in the transparent mode. The data are transmitted transparently, but either end effects a compression to compare the results obtained for an estimation of the effectiveness of the compression. In the case where the comparison turns out to be effective, the transmitter and the receiver switch each to the compression mode. In the compression mode, only the transmitter continues to calculate the effectiveness of the compression and when it detects its ineffectiveness, it sends to the receiver in the data packet a check code as an indication to the receiver to change to the transparent mode.

Although this method may bring satisfaction in certain cases, it has certain disadvantages which can be eliminated by the invention in the case where the data stream to be processed is relatively homogeneous.

On the one hand, this method makes it necessary to perform a compression operation even when it is not used for the transmission, and this is when an adaptive compression algorithm is used, on either end of the link, so that the compression dictionaries used by either are identical. Consequently, the execution time in the transparent mode is very long and the receiver is sometimes to perform a decompression and sometimes a compression, so that a twofold organization in respect of the access to the dictionaries is necessary, which requires more memory space.

On the other hand, this method does not guarantee a small and definite limited expansion in terms of number of packets or segments. In the worst case there may be a change of mode of operation (compression mode or transparent mode) for practically each packet, and a systematic expansion of the packet when the compression mode prevails, that is to say, an additional packet is generated. Moreover, the check code transmitted to the receiver to indicate to the receiver that it has to change to the transparent mode can itself be the cause of an expansion.

SUMMARY OF THE INVENTION

It is an object of the invention to overcome these drawbacks.

Therefore, a data transmission system according to the invention and as described in the introductory paragraph is characterized in that the transmitter and the receiver which are synchronized comprise:

evaluation means for evaluating the obtained compression rate, and switch means for switching from the first to the second mode of operation when the compression of a predetermined number of data is no longer effective for the transmission and reception, respectively.

The invention provides the advantage of being totally independent of the type of compression used.

In a particularly advantageous embodiment of the transmission system according to the invention and in said first mode of operation, the transmitter and the receiver comprise means for:

compressing and decompressing respectively, a first number of data, comparing the obtained compression rate with a predetermined threshold value, remaining in this first mode of operation if the obtained compression rate is the higher one, switching to said second mode of operation if not, and in said second mode of operation:

directly transmitting and receiving respectively, a second number of data without compression or decompression, then switching to the first mode of operation.

In practice, when the heterogeneous data streams are not multiplexed before being compressed, the reductions of the compression rates are more often linked with a lasting change of the type of data to be transmitted than with a rapid alternation of data that can be compressed and data that cannot be compressed at all. The invention which makes it possible to "let pass" a certain number of data without compression, thus perfectly solves this type of problem.

Moreover, the invention makes it possible to guarantee a maximum expansion of the data which is contrary to the prior-art solution. If one considers, for example, that the first and second numbers of data are equal to 4 koctets and 64 koctets respectively, in the worst case an expansion by 32 segments will be obtained for packets of 128 octets during the transmission of the first number of data in the compressed mode. This represents a 3% expansion (if the charging segment is 64 octets).

In order to guarantee a sufficiently low maximum expansion, the ratio between said second and said first number of data is advantageously selected higher than 10.

The invention likewise relates to network interconnection equipment intended to be used as a transmitter or a receiver in a transmission system described hereinbefore, as well as a data compression method used by such equipment.

BRIEF DESCRIPTION OF THE DRAWINGS

These and other aspects of the invention will be apparent from and elucidated with reference to the embodiments described hereinafter.

In the drawings.

DESCRIPTION OF PREFERRED EMBODIMENTS

Figure 1:
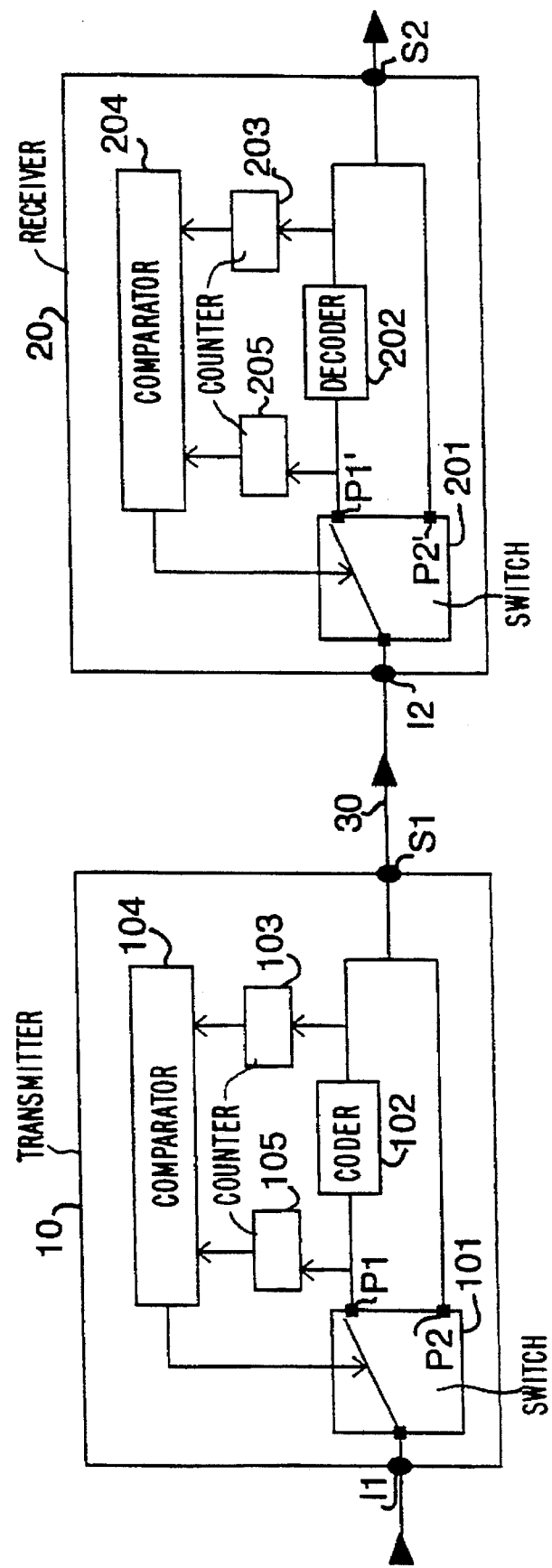
FIG. 1 shows an example of a transmission system according to the invention.

According to FIG. 1, a transmission system according to the invention comprises a transmitter 10 and a receiver 20 which communicate by a communication channel 30. The transmitter 10 itself comprises a switch 101.

In a first position P1 this switch 101 is connected to a coder 102 which encodes the data by utilizing a data compression algorithm. In this example a "Ziv Lempel" type of adaptive algorithm is employed as described by CCITT Recommendation V42 bis concerning asynchronous modems; however, the invention is totally independent of the type of algorithm used. The output of the encoder 102 is connected to an output S1 of the transmitter 10, on the one hand, and to the input of a counter 103, on the other, which counts the number of data transmitted by the transmitter. The output of the counter forms a first input of a comparator 104. The other input of the comparator 104 is formed by the output of a counter 105 whose input is connected to the input of the encoder 102 for counting the number of data arriving at the input of the transmitter. The output of the comparator 104 controls the switch 101.

Thus, by supposing that the transmitter 10 starts by transmitting a first number of data d (equal to 4 koctets, for example) in the compression mode, the switch 101 is in position P1. When the counter 105 has reached 4 koctets, the comparator reads the contents of the counter 103 and calculates the corresponding compression rate after which it resets the counters 103 and 105 to zero. If the compression rate thus obtained is lower than a predetermined threshold Ts (1.2, for example), it sends to the switch 101 a command to switch to a second position P2. If not, the switch remains in position P1.

In the second position P2, the output of the switch 101 is directly connected to the output S1 of the transmitter 10, so that the data are transmitted in the transparent mode.

In this case, when the counter 103 has reached a second number of data D (equal to 64 koctets, for example), the comparator 104 sends to the switch 101 a command to switch to position P1, after which it resets the counter 103 to zero.

Similarly, the receiver 20 comprises a switch 201 which has a first and a second position P1' and P2'. In the first position P1' this switch 201 is connected to a decoder 202 which decodes the data so as to decompress them. The output of the decoder 202 is connected to the output S2 of the receiver 20, on the one hand, and, on the other hand, to the input of a counter 203 which counts the number of data received by the receiver which are decompressed once. The output of this counter forms a first input of a comparator 204. The other input of the comparator 204 is formed by the output of a counter 205 whose input is connected to the output P1' of the switch 201 so as to count the number of data received on input 12 of the receiver 20. The output of the comparator 204 controls the switch 201.

During the starting phase, the transmitter and the receiver conduct negotiations about the various parameters of the communication (first and second number of data, threshold value of the data compression rate). Then, a first number of data d is transmitted by the transmitter 10 in the compression mode. The switch 201 is thus to be put to position P1'. When the counter 203 reaches the first number of data (4 koctets in this example), the comparator 204 reads the contents of the counter 205 and calculates the corresponding compression rate after which it resets the counters 203 and 205 to zero. If the compression rate thus obtained is lower than the threshold Ts, the comparator 204 sends to the switch 201 a command to change to a second position P2'. If not, the switch 201 retains its position P1'

In position P2', when the data have been transmitted in the transparent mode, the output of the switch 201 is directly connected to the output S2 of the receiver 20.

In this case, when the counter 203 has reached the second number of data D, the comparator 204 sends to the switch 201 a command to change to position P1', after which it resets to counter 203 to zero.

The transmitter and the receiver being synchronized, and the values of the various parameters of the communication being negotiated when they are established, there is no need to send any additional indication to the receiver to indicate a change of mode of operation to the receiver.

Figure 2:
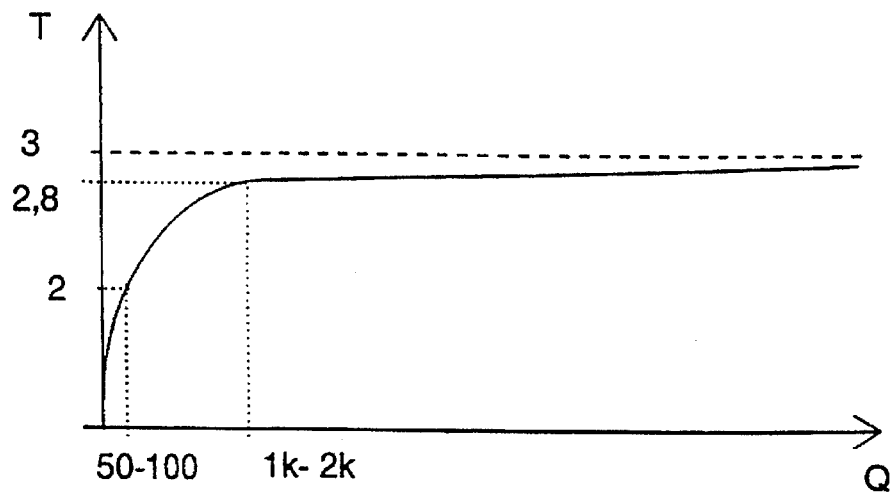
FIG. 2 shows a convergence curve of the compression rate as a function of the transmitted number of data.

The values of the first and second numbers of data d and D, and the value of the threshold Ts are selected by the user depending on his needs and on the type of data he uses while he bases himself, for example, on a curve of the type shown in FIG. 2 which represents the convergence of the compression rate T plotted against the processed number of data Q for data of a relatively homogeneous type.

According to FIG. 2 one reaches in this case a compression rate close to 2 after 50 to 100 octets have been processed, and a compression rate near to 2.8 after 1 to 2 koctets have been processed, for a maximum compression rate close to 3.

Nevertheless, it is important to observe that the maximum expansion of the data decreases as the ratio D/d increases.

In another embodiment the counters 103 and 105 of the transmitter and the counters 203 and 205 of the receiver count the number of charging segments which correspond to the number of transmitted data, instead of counting the number of data transmitted as has been described above. The choice between these two modes of operation forms part of the parameters which are negotiated when the communication is established.

Figure 3:
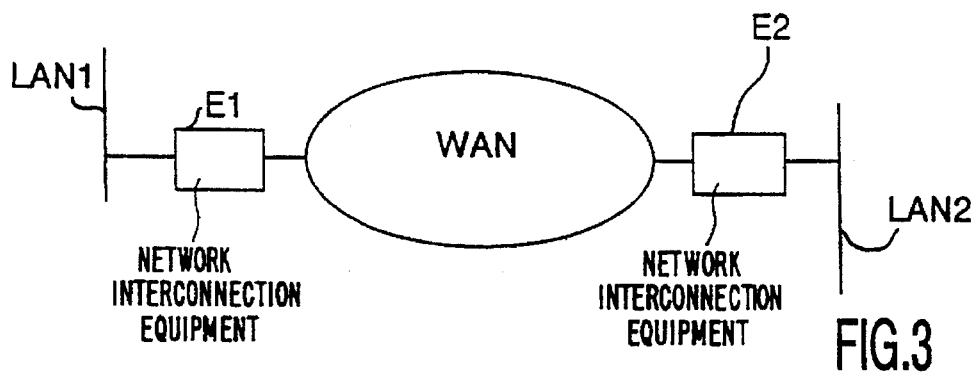
FIG. 3 shows an example of a wide area network transmission system according to the invention.

FIG. 3 shows another example of the transmission system according to the invention in the field of wide area network transmissions. Such a transmission system comprises two pieces of network interconnection equipment E1 and E2 which alternately play the role of transmitter and receiver. These two pieces of equipment are connected to a packet charging wide area network such as, for example, the X25 Transpac network, and also to local area networks LAN1 for the piece of equipment E1 and LAN2 for the piece of equipment E2. Each of these two pieces of equipments thus comprises both a transmitter and receiver as represented in FIG. 1.

In a particularly simple and thus high-performance embodiment there is provided that the comparators 104 and 204 of the pieces of interconnection equipment of transmitting and receiving networks wait until the end of the processing of the current packet before they send a switching command to the switches 101 and 201. However, a particular operation is provided for the packets belonging to a whole sequence of packets as defined by the X25 standard (bit M activated for all the packets of the sequence except for the last packet). The packets of such a sequence thus form a whole and when the interfaces X25 of the transmitter and of the receiver utilize different packet sizes, the ends of the packets no longer systematically coincide at the transmitter and receiver ends. To remedy this problem it would be possible to wait for the end of the whole sequence before the switch command is sent. But a whole sequence may be long; nothing prevents a user, for example, from transferring a non-compressible file in the form of a whole sequence. This solution is thus unacceptable.

According to the invention, when the switching threshold is reached during a packet of a whole sequence, the bit M of this packet is deactivated so as to create the end of the whole sequence, and an indicator is added to signal this (this indicator is formed, for example, by a reserved code word of the "Ziv Lempel" algorithm). Then the switch command is sent. At the receiver end, the indicator makes it possible to detect that the end of the whole sequence has been created by the transmitter for reasons of compression. The comparator 204 thus sends the switch command and activates again the bit M so as to reconstitute the whole original sequence.

Figure 4:
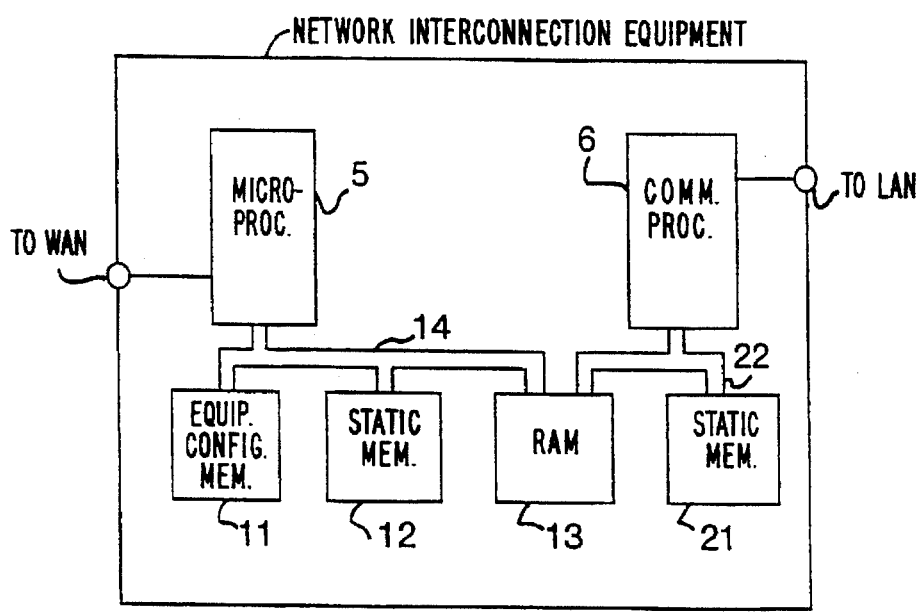
FIG. 4 shows an example of a piece of network interconnection equipment according to the invention.

FIG. 4 describes in a more detailed way a piece of local area network interconnection equipment as represented in FIG. 3. Such a piece of equipment comprises an interface IW to the wide area network WAN X25 and at least one interface IL to the local area networks LAN1 and LAN2, respectively. The interface IW to the wide area network is connected to a microprocessor 5 which is, for example, a 68302 manufactured by Motorola. This microprocessor 5 itself is connected by a bus 14 to a memory 11 called equipment configuration memory, to a static memory 12 which contains the operating instructions of the microprocessor 5, especially those necessary for implementing the invention, and to a random-access memory 13 which contains data. The interface IL to the local area networks LAN1 and LAN2 is connected to a communication processor 6 formed, for example (for the Ethernet local area networks) by an Intel 82503 transmitter and an Intel 82596 DX processor. This communication processor 6 is itself connected by a bus 22 to a static memory 21 which contains the operating instructions of the communication processor 6, and to said data memory 13.

Figure 5:
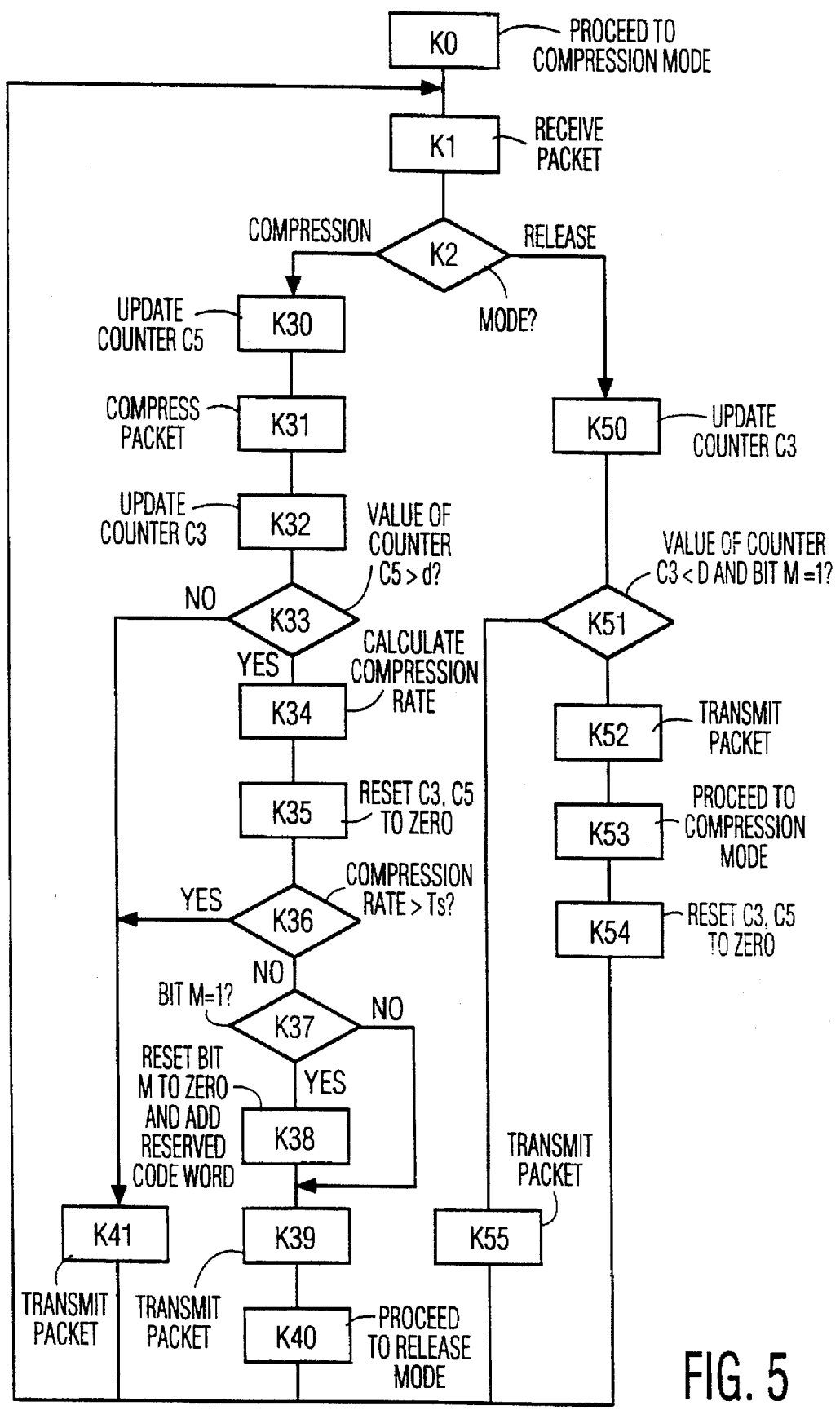
FIG. 5 shows a flow chart of an example of data compression method intended to be used in a piece of network interconnection equipment as described with reference to FIGS. 3 and 4.

FIG. 5 presents a flow chart of a data compression method intended to be used in a piece of network interconnection equipment as described with reference to FIGS. 3 and 4. In order to combine in this flow chart the case where the equipment operates as a transmitter and the case where it operates as a receiver, the counters 105 and 205 will be combined under the reference C5 and the counters 103 and 203 under the reference C3.

The connotation of the various boxes of this flow chart when this equipment operates as a transmitter will be given below:

box K0: the initial mode of operation of the equipment is the "Compression" mode box K1: the method is waiting for receiving a packet on the transmitting or receiving input of the equipment. Once a packet has been received, box K2 is proceeded to.

box K2: test of the mode of operation of the equipment. If a "Compression" mode is active, the method proceeds to box K30, if not, a transparent mode of operation termed "release" mode is active and box K50 is proceeded to.

box K30: updating of the counter C5 by feeding thereto the number of data contained in the current packet.

box K31: compression of the current data packet.

box K32: updating of the counter C3 by feeding thereto the number of data resulting from this compression.

box K33: test of the value of counter C5. If it is higher than the first number (d) of data, the method proceeds to box K34, if not, it proceeds to box K41.

box K34: calculation of the compression rate based upon values of the counters C3 and C5.

box K35: the counters C3 and C5 are reset to zero.

box K36: comparison of the obtained compression rate with threshold Ts. If it is higher than Ts, the method proceeds to box K41, if not, it proceeds to box K37.

box K37: test of the value of the bit M (defined in the CCITT X25 standard) of the current packet. If it is equal to 1, the method continues with box K38, if not, it proceeds to box K39.

box K38: bit M is reset to zero and to the end of the compressed packet is added the reserved code word of the "Ziv Lempel" algorithm which indicates that the end of the whole sequence has been created. Then the method continues with box K39.

box K39: transmission of the packet with a possible adaptation of the packet to the size that can be used in the interface.

box K40: the equipment is changed to the "Release" mode of operation. Then the method starts again with box K1.

box K41: transmission of the packet with a possible adaptation of the packet to the size that can be used in the interface. After this the method starts again with box K1.

box K50: the counter C3 is updated in that the number of data contained in the current data packet are added thereto.

box K51: test of the value of the counter C3 and of the bit M. If the count of counter C3 is lower than the second number (D) of data or if the bit M is equal to 1, the method proceeds to box K55. If not, it proceeds to box K52.

box K52: transmission of the packet. After this box K53 is proceeded to.

box K53: the "Compression" mode of operation is proceeded to.

box K54: the counters C3 and C5 are reset to zero after which the method starts again with box K1.

box K55: transmission of the packet. After this the method starts again with box K1.

When the equipment operates as a receiver, certain boxes of this flow chart have different connotations which will be explained below:

box K31: memorization of the possible reserved code word which indicates that the end of a whole sequence has been created and then decompression of the current data packet.

box K32: updating of the counter C3 in that the number of data resulting from this decompression are added thereto.

box K33: test of the value of counter C3 and of the bit M. If the counter C3 is higher than the first number of data d and if the bit M has a zero value, the method proceeds to box K34. If not, it proceeds to box K41.

box K37: if the reserved code word indicating a created end of a whole sequence is present, the method proceeds to box K38, if not it proceeds to box K39.

box K38: bit M is reset to "one" and the method continues with box K39.

Needless to observe that modifications may be made in the embodiments that have just been described more specifically by substituting equivalent technical means, without one leaving the scope of the present invention.

I claim:

1. A data transmission system comprising at least a transmitter and a receiver, each of which comprise switch means for switching between (i) a first mode of operation according to which transmitted or received data are encoded or decoded, respectively, to compress or decompress the transmitted or received data, respectively, and (ii) a second mode of operation according to which data are transmitted or received directly without encoding or decoding, wherein further said transmitter and said receiver are synchronized and still further each comprise evaluation means for evaluating an obtained compression rate, wherein each said switch means is configured for switching from the first mode of operation to the second mode of operation in response to an evaluation by the evaluation means of a compression rate obtained of a predetermined number of data and a determination based thereon that compression is no longer sufficiently effective for transmission and reception, respectively, whereby said transmitter and said receiver can each independently switch from the first mode of operation to the second mode of operation, synchronously with each other, without the need to send an indication from one to the other of such change of mode of operation.

2. A data transmission system as claimed in claim 1, further wherein:

in said first mode of operation, said transmitter and said receiver further comprise means for compressing and decompressing, respectively, a first predetermined number (d) of data, comparing the obtained compression rate with a predetermined threshold value, and remaining in this first mode of operation if the obtained compression rate is higher than the predetermined threshold value and switching to the second mode of operation if not, and in said second mode of operation said transmitter and said receiver further comprise means for directly transmitting and receiving, respectively, a second predetermined number (D) of data without compression or decompression, and then in response to said second predetermined number of data (D) being transmitted or received, switching to the first mode of operation.

3. A data transmission system as claimed in claim 2, wherein a ratio between the second and first numbers of data exceeds 10.

4. Network interconnection equipment intended to exchange data in a transmit mode or in a receive mode with a piece of wide area network interconnection equipment, said network interconnection equipment comprising means for switching between (i) a first mode of operation according to which data it transmits or receives are encoded or decoded, respectively, so as to compress or decompress transmitted or received data, respectively, and (ii) a second mode of operation according to which it transmits or receives directly data without encoding or decoding, respectively, wherein said switch means is further configured for switching from the first mode of operation to the second mode of operation in response to a determination made, based on evaluation of a compression rate obtained in a first predetermined number (d) of data, that compression is no longer sufficiently effective for transmission and reception, respectively and for switching from the second mode of operation to the first mode of operation in response to a second predetermined number of data (D) being transmitted or received.

5. Network interconnection equipment as claimed in claim 4, wherein:

in said first mode of operation, said network interconnection equipment further comprises means for compressing the first predetermined number of transmit data (d), or decompressing the first predetermined number (d) of received data, respectively, comparing an obtained compression rate with a predetermined threshold value, and remaining in this first mode of operation if the obtained compression rate is higher than the predetermined threshold value and switching to the second mode of operation if not, and in said second mode of operation, said network interconnection equipment further comprises means for directly transmitting or receiving, respectively, the second predetermined number (D) of data without compression or decompression, respectively, and then switching to the first mode of operation.

6. A compression method for compressing data transmitted between a transmitter and a receiver wherein the transmitter and the receiver each comprise switch means for switching between (i) a first mode of operation according to which transmitted or received data are encoded or decoded, respectively, so as to compress or decompress the transmitted or received data, respectively, and (ii) a second mode of operation according to which data are transmitted or received directly without coding or decoding, respectively, said method comprising for the transmitter and the receiver, respectively, the steps of:

in said first mode of operation compressing and decompressing, respectively, a first predetermined number (d) of data, comparing an obtained compression rate with a predetermined threshold value, and remaining in this first mode of operation if the obtained compression rate is higher than the predetermined threshold value and switching to the second mode of operation if not, and in said second mode of operation directly transmitting and receiving, respectively, a second predetermined number (D) of data without compression or decompression, respectively, and then in response to said second predetermined number of data (D) being transmitted or received, switching to the first mode of operation.

7. A data transmission system as claimed in claim 1, wherein said transmitter and said receiver form a network interconnect equipment.

* * * * *